US006978122B2

(12) United States Patent
Kawakyu et al.

(10) Patent No.: US 6,978,122 B2
(45) Date of Patent: Dec. 20, 2005

(54) HIGH-FREQUENCY SWITCHING DEVICE INCORPORATING AN INVERTER CIRCUIT

(75) Inventors: Katsue Kawakyu, Kawasaki (JP); Naotaka Kaneta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 722 days.

(21) Appl. No.: 10/153,587

(22) Filed: May 24, 2002

(65) Prior Publication Data

US 2002/0177415 A1    Nov. 28, 2002

(30) Foreign Application Priority Data

May 25, 2001  (JP) .............................. 2001-157487

(51) Int. Cl.[7] .......................................... H03K 17/693
(52) U.S. Cl. .................. 455/80; 455/78; 455/338; 327/381; 327/379; 327/564; 327/565
(58) Field of Search .................... 455/338, 334, 455/280, 78, 80, 81, 82; 327/83, 379, 380, 327/381, 408, 427, 564, 565

(56) References Cited

U.S. PATENT DOCUMENTS

| 5,880,621 A    * | 3/1999 | Ohashi ...................... 327/534 |
| 6,847,275 B2  * | 1/2005 | Sayanagi et al. ........... 333/247 |
| 2001/0009387 A1 * | 7/2001 | Isono et al. ................. 327/504 |

* cited by examiner

*Primary Examiner*—Nick Corsaro
*Assistant Examiner*—Raymond B. Persino
(74) *Attorney, Agent, or Firm*—Oblon, Spivak, McClelland, Maier & Neustadt, P.C.

(57) ABSTRACT

A high frequency switching device includes a control terminal, a power source terminal, a GND terminal, an RF terminal, a switch section, a control section, and protecting diodes. The switch section switches input/output routes of an RF signal input from the RF terminal. The control section controls the switching section, and is connected to the control terminal and the power source terminal. The protecting diodes are provided between the control terminal and the RF terminal, between the control terminal and the GND terminal, and between the power source terminal and the GND terminal.

16 Claims, 7 Drawing Sheets

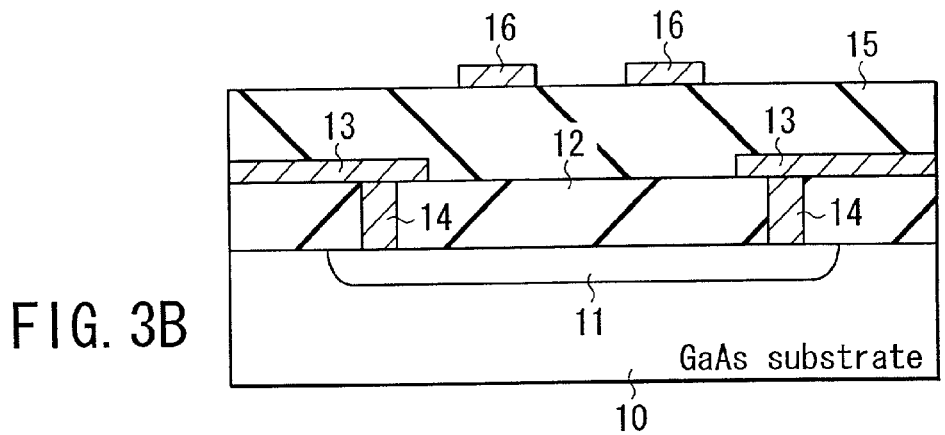
FIG. 3B
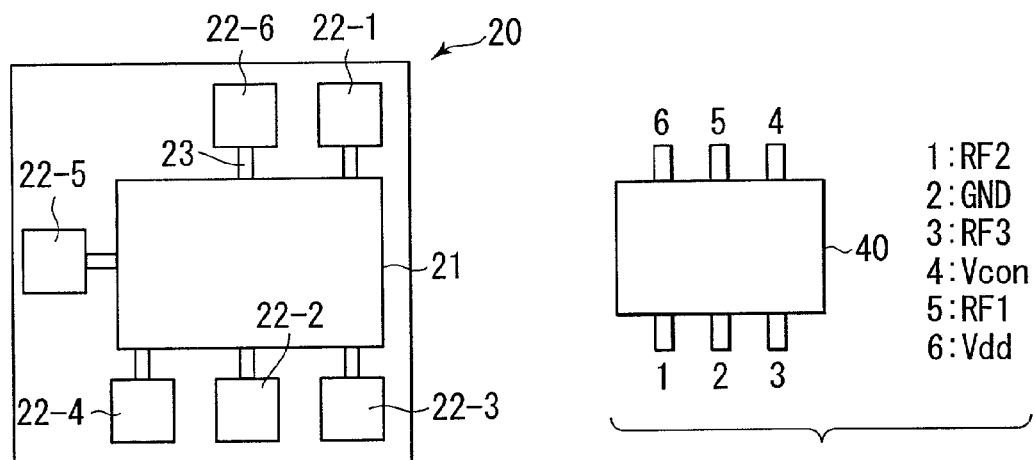
FIG. 3C
FIG. 3E
1: RF2
2: GND
3: RF3
4: Vcon
5: RF1
6: Vdd
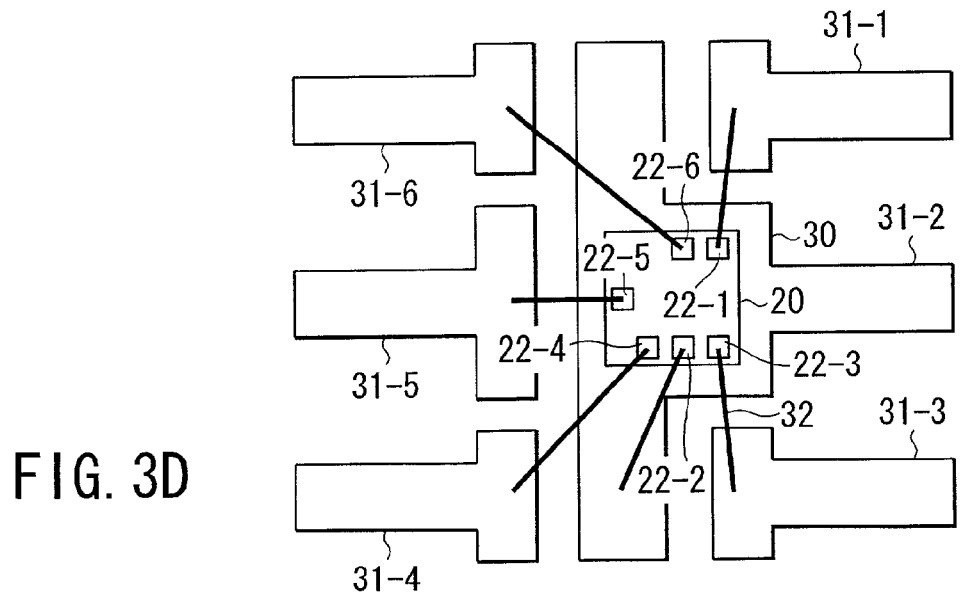
FIG. 3D

HIGH-FREQUENCY SWITCHING DEVICE INCORPORATING AN INVERTER CIRCUIT

CROSS-REFERENCE TO RELATED APPLICATIONS

This application is based upon and claims the benefit of priority from the prior Japanese Patent Application No. 2001-157487, filed May 25, 2001, the entire contents of which are incorporated herein by reference.

BACKGROUND OF THE INVENTION

1. Field of the Invention

The present invention relates to a high-frequency switching device which switches two transmission routes of an RF signal.

2. Description of the Related Art

A high-frequency switching device is used in a cellular phone, a PHS (Personal Handy Phone System) or the like. Conventionally, a high-frequency switch having a circuit configuration utilizing on/off operations of a PIN diode is mainly incorporated in these systems. However, a switch having the configuration does not satisfy the downsizing requirement of devices in recent years. Therefore, switches using FETs have become mainstream. Further, a type of switch incorporating a control circuit has been noted recently. Since a switch of this type has only one control terminal, the system design burdens are reduced.

FIG. 1A shows an example of the circuit configuration of an SPDT (Single Port Double Throw) switch incorporating an inverter circuit.

As shown in FIG. 1A, the SPDT switch operates using a positive voltage as a single power source. Since the SPDT switch has two transmission routes, it requires two control signals inverted relative to each other. Therefore, the SPDT switch having a single input terminal for control signals is attained by incorporating an inverter circuit in the switch. The SPDT switch has a switch section 210 and a control section (inverter section) 230. A GaAs FET is generally used as an FET contained in the SPDT switch in a microwave band. It is desirable that the SPDT switch be implemented as an MMIC (Monolithic Microwave IC), comprising a single GaAs chip and semiconductor elements formed thereon. In the MMIC, since a plurality of terminals can be integrated to one terminal, external members can be reduced. In addition, the SPDT switch can be implemented in a compact package having a small number of pins. FIG. 1A shows a circuit configuration based on the assumption that the switch is implemented in a six-pin package.

An RF terminal 201 is connected to an RF terminal 202 via a current path of an FET 211. The RF terminal 202 is connected to a power source terminal 204 via a current path of an FET 213. The RF terminal 201 is also connected to an RF terminal 203 via a current path of an FET 212. The RF terminal 203 is connected to the power source terminal 204 via a current path of an FET 214. In the following descriptions, the FETs 211 and 212 are called the through FETs, while the FETs 213 and 214 are called the shunt FETs. The power source terminal 204 is grounded via a capacitor element 220, and receives power supplied through a resistor element.

A control terminal 205 is connected to an input terminal 231 of the inverter section 230. It is connected to the gate of the shunt FET 214 via a resistor element 224 and to the gate of the through FET 211 via a resistor element 221. An output terminal 232 of the inverter section 230 is connected to the gate of the shunt FET 213 via a resistor element 223 and to the gate of the through FET 212 via a resistor element 222. The resistor elements 221 to 224 and a bias resistor element 225 for the through FETs 211 and 212 have high resistance of a value, for example, several kΩ.

In the SPDT switch operating by means of the power source voltage of 3V as a single power source, for example, when a control signal voltage of 0V is applied, the FET 211 is off and the FET 212 is on. Therefore, an RF signal transmits between the RF terminals 201 and 203. To the contrary, when a control signal voltage of 3V is applied, the FET 211 is on and the FET 212 is off. Therefore, an RF signal transmits between the RF terminals 201 and 202. Thus, the switch incorporating the inverter circuit can be controlled through one terminal.

The inverter section 230 has an E/D type inverter circuit 250 including a driver FET 252 and a load FET 251, and a source follower circuit 240 positioned in a stage before the inverter circuit 250. The source follower circuit 240 aims at a level shift of the voltage input to the gate of the driver FET 252, such that the maximum voltage does not exceed the Schottky voltage. Therefore, although the shift amount of the voltage is determined by two FETs 242 and 243, the number of FETs required for this purpose depends on the power source voltage. Of the aforementioned circuits, the FETs 211–214, 241–244 and 251 are depletion type FETs, and the FET 252 is an enhancement type FET.

The source follower 240 is necessary to keep the low-level potential output from the inverter circuit sufficiently low, thereby suppressing distortion when a large signal is input. In this description, the terms "high level" and "low level" respectively mean the level of the voltage output from the inverter circuit 250 when the signal "0" is input and the level of the voltage output from the inverter circuit 250 when the signal "1" is input.

If there is no source follower circuit 240, a Schottky current flows when the input voltage exceeds the Schottky voltage (approximately 0.7V). Then the potential of the low level is increase by a voltage drop in a source resistor of the FET 252. For example, when the input voltage is 3V, the voltage at the output terminal 232 is 0.8V. If the potential of the low level increases, a linear output cannot be obtained when a large signal is input, resulting in occurrence of distortion. To describe this phenomenon, it is assumed that a signal is input through the RF terminal 201 of the switch section 210 and output through the RF terminal 202 via the on-state through FET 211.

FIG. 1B shows the relationship between a gate-source voltage (Vgs) and a current in the off-state through FET 212. If the power source voltage is 3V and voltages of 3V and 0V are respectively applied to the gate terminals of the FET 211 and the FET 212, the gate-source voltage Vgs of the FET 212 is −3V. When an RF signal is input through the terminal 201, the voltage Vgs has an amplitude in accordance with the input voltage. When a large signal is input, the voltage Vgs exceeds the threshold voltage (Vth) in the FET 212. Therefore, the through FET 212, which has been in the off state, is turned on during a certain time period. When the through FET 212 is on, the current begins to flow to the terminal 203 and the waveform of the RF signal is deformed. Then, radio noise other than the fundamental, such as a second or third harmonic spurious, is generated. As a result, trouble may occur in the system. An increase in low-level potential shifts the voltage Vgs of the off-state through FET 212 to the positive side by the increased voltage. Consequently, the through FET 212 is turned on at a lower input voltage. As described above, the high-level and low-level potentials of the inverter circuit 150 greatly influences the distortion when a large signal is input. Therefore, these potentials must be fully taken into consideration when the inverter circuit is designed.

The high-frequency switching circuit having the source follower circuit 240 is described in, for example, U.S. patent application Ser. No. 09/264,003.

As mentioned above, the control switch incorporating an inverter circuit that has a single input terminal for control signals is mainly used for mobile devices, such as cellular phones. Since the mobile devices are battery-driven, they require reduction in power consumption. Therefore, it is desirable that the current consumed by the inverter circuit be as small as possible, specifically, 1 mA or less.

Reduction in gate width of FETs can satisfy the above requirement. As the gate width is reduced, the FETs are less resistant to surge. An FET having a relatively wide gate width of about, for example, 1 mm, can be used to constitute a switch circuit in order to reduce ON resistance. Therefore, surge is not a serious problem in an SPDT switch comprising only a switch circuit. However, an inverter circuit uses an FET having a gate width of 10 μm or smaller. Therefore, an SPDT switch incorporating an inverter circuit suffers from the problem of damage of the inverter circuit by surge, so that the SPDT switch cannot be operated.

In the case where a switch is implemented by an MMIC including a switch section and an inverter section formed on a single chip, a signal may be leaked from the switch section to the inverter section when a large signal is input. Then, the operation of the inverter circuit, driven by a small current, is liable to be unstable. For example, if a wire for transmitting an RF signal crosses over a wire connected to the output terminal of the inverter circuit, the RF signal will leak to the latter wire. In this case, fluctuations of the potential of the output terminal of the inverter circuit will be a problem. To describe this problem, with reference to FIG. 1A, a case is considered in which the power source voltage is 3V and the voltage at the control terminal 205 is 0V, so that the output terminal 232 of the inverter circuit 250 is 3V, and consequently a signal transmits from the RF terminal 201 to the RF terminal 203.

FIG. 1C shows influences of an input signal to the switch section on the potential of the output terminal of the inverter circuit. More specifically, it shows a change with time in potential of the output terminal 232 of the inverter circuit, where a crossover capacitance between the RF terminal 201 and the output terminal 232 is 100 fF and signals of 0 dBm and 20 dBm are input to the RF terminal 201. For input power of 0 bBm, the potential at the output terminal 232 does not substantially change. For input power of 20 dBm, on the other hand, the potential at the output terminal 232 ranges between 1V and 4V. For example, since the power source voltage is 3V, if the potential at the output terminal 232 is 1V, the gate-source voltage Vgs of the through FET 212 is –2V. Thus, if the threshold voltage Vth of the FET is –1.5V, the gate-source voltage Vgs of the FET 212 is smaller than the threshold voltage Vth. Therefore, the FET 212 cannot be turned on in this case, and the signal cannot pass through the FET 212 during this period of time. This matter is manifested as a distortion of a signal transmitting from the RF terminal 201 to the RF terminal 203, resulting in deterioration of input/output power characteristics. The leakage of the RF signal described above greatly influences distortion characteristics. The more the leakage of the RF signal resulting from the crossover capacitance, the less input power causes distortion. The leaked signal influences not only the output terminal, that is, a signal leaked from the switch section may influence the input terminal, the power source terminal and the GND terminal of the inverter circuit. However, since these terminals extend out of the package, measures against the influence can be taken: for example, a decoupling capacitance can be provided in the substrate. In contrast, the output terminal is formed inside the chip. It is difficult to provide an effective decoupling capacitance inside the chip, since there is a limit to the chip size.

Further, when the MMIC is mounted in a six-pin package, it is necessary that the RF terminal 201 be opposed to the other RF terminals 202 and 203, for example, as shown in FIG. 1D. Further, it is preferable that the wire connected to the RF terminal 201 be prevented from crossing over the wire connected to the DC terminal of the switch section or any wires of the inverter circuit. In the conventional circuit configuration, the wiring must be detoured around in order to prevent crossing of the wires. Consequently, the problem of an increase in chip size arises.

BRIEF SUMMARY OF THE INVENTION

A high frequency switching device according to an aspect of the present invention comprises:

a control terminal;

a power source terminal;

a GND terminal;

an RF terminal;

a switch section which switches input/output routes of an RF signal input from the RF terminal;

a control section which controls the switching section, the control section connected to the control terminal and the power source terminal; and protecting diodes provided between the control terminal and the RF terminal, between the control terminal and the GND terminal, and between the power source terminal and the GND terminal.

BRIEF DESCRIPTION OF THE SEVERAL VIEWS OF THE DRAWING

FIG. 3B is a cross-sectional view of a part of the SPDT switch according to the second embodiment;

FIG. 3C is a plan pattern diagram of the SPDT switch according to the second embodiment;

FIG. 3D is a plan pattern diagram of a lead frame on which the SPDT switch according to the second embodiment is mounted;

FIG. 3E is an external view of a package of the SPDT switch according to the second embodiment;

DETAILED DESCRIPTION OF THE INVENTION

Figure 2:
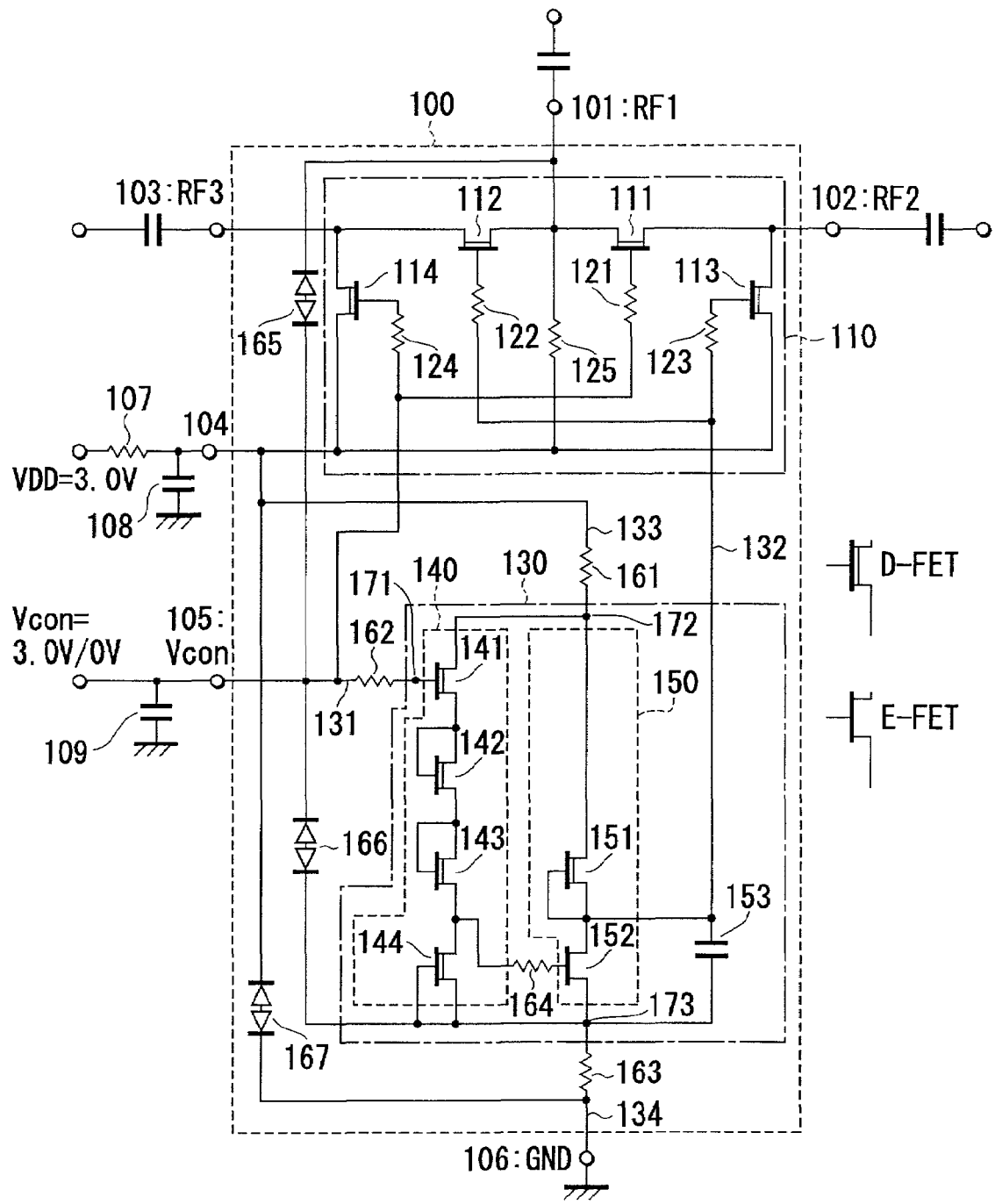
FIG. 2 is a circuit diagram of an SPDT switch according to a first embodiment of the present invention.

A switch incorporating a control circuit will be described with reference to FIG. 2 as an example of a high-frequency switching device according to a first embodiment of the present invention. FIG. 2 is a circuit diagram of a high frequency SPDT switch formed as an MMIC (Monolithic Microwave IC), which is mounted in a six-pin package in particular.

As shown in FIG. 2, a high-frequency SPDT switch MMIC (hereinafter abbreviated as MMIC) 100 comprises six terminals 101–106, a switch section 110, a control section (inverter section) 130, a capacitor element 153, resistor elements 161–164 and protecting circuits 165–167.

A high-frequency signal (RF signal) transmits between the RF terminals 101 and 102 and between the RF terminals 101 and 103. The power source terminal 104 receives a power source potential through a resistor element 107 and grounded via a capacitor element 108. The control terminal 105 receives a control signal Vcon and grounded via a capacitor element 109. The GND terminal 106 receives a ground potential.

The switch section 110 has FETs 111–114 and resistor elements 121–125. The RF terminal 101 is connected to the RF terminal 102 through a current path (between the source and the drain) of the FET 111. The RF terminal 102 is connected to the power source terminal 104 through a current path of the FET 113. The RF terminal 101 is also connected to the RF terminal 103 through a current path of the FET 112. The RF terminal 103 is connected to the power source terminal 104 through a current path of the FET 114. The resistor element 121 is provided between a gate of the FET 111 and the control terminal 105. The resistor element 122 is provided between a gate of the FET 112 and an output terminal 132 of the inverter section 130 to be described later. The resistor element 123 is provided between a gate of the FET 113 and the output terminal 132 of the inverter section 130. The resistor element 124 is provided between a gate of the FET 114 and the control terminal 105. The resistor element 125 is provided between the RF terminal 101 and the power source terminal 104. The resistor element 125 functions as a bias resistor for the FETs 111 and 112.

The inverter section 130 includes a first terminal 171, a second terminal 172, a third terminal 173, a source follower circuit 140 having a plurality of FETs and an inverter circuit 150 having a plurality of FETs. The first, second and third terminals 171, 172, 173 are connected to the control terminal 105, power source terminal 104 and GND terminal 106, respectively. The source follower circuit 140 aims at a level shift of the voltage input to the gates of the FETs constituting the inverter circuit 150, particularly such that the maximum value of the gate voltage, applied to an enhancement-type FET 152 for switching, does not exceed the Schottky voltage.

More specifically, the source follower circuit 140 has depletion-type FETs connected in series, for example, depletion-type GaAs MESFETs (hereinafter referred to as D-FETs) 141–144. The D-FET 141 has a drain electrically connected to the power source terminal 104 of the inverter section 130 through the second terminal 172, a gate electrically connected to the control terminal 105 of the inverter section 130 through the first terminal 171 and a source connected to a drain and a gate of the D-FET 142. The D-FET 142 has a source connected to a drain and a gate of the D-FET 143. The D-FET 143 has a source connected to a drain of the D-FET 144. The D-FET 144 has a gate and a source connected to the GND terminal 106 of the inverter section 130 through the third terminal 173.

The inverter circuit 150 has a depletion-type FET, for example, a depletion-type GaAs MESFET (hereinafter referred to as D-FET) 151 and an enhancement-type FET, for example, an enhancement-type GaAs MESFET (hereinafter referred to as E-FET) 152. The FETs 151 and 152 are connected in series. The D-FET 151 has a drain electrically connected to the power source terminal 104 through the second terminal 172, and a gate and a source connected to a drain of the E-FET 152. The E-FET 152 has a gate electrically connected a node interconnecting the D-FETs 143 and 144 of the source follower circuit 140, and a source connected to the GND terminal 106 through the third terminal 173. A node interconnecting the D-FET 151 and the E-FET 152 is connected to an output terminal of the inverter circuit 150, i.e., to the output terminal 132 of the inverter section 130.

The capacitor element 153 is provided between the output terminal 132 of the inverter section 130 and the third terminal 173.

The resistor element 161 is provided between the power source terminal 104 and the second terminal 172, namely the drains of the D-FET 141 and 151 included in the inverter section 130. The resistor element 162 is provided between the first terminal 171, namely the gate of the D-FET 141 and the control terminal 105. The resistor element 163 is provided between the GND terminal 106 and the third terminal 173, namely the source of the E-FET 152 and the gate and the source of the D-FET 144. The resistor element 164 is provided between the gate of the E-FET 152 on one hand and the connecting node between the source of the D-FET 143 and the drain of the D-FET 144 on the other.

The protecting circuit 165 has one end connected to the RF terminal 101 and another end connected to the control terminal 105. The protecting circuit 166 has one end connected to the control terminal 105 and another end connected to the third terminal 173. The protecting circuit 167 has one end connected to the power source terminal 104 and another end connected to the GND terminal 106. Each of the protecting circuits 165 to 167 includes diodes connected in the opposite directions. The protecting circuits 165 to 167 are hereinafter referred to as the protecting diodes 165 to 167.

In the SPDT switch having the above structure, when the control signal Vcon=3V is input to the control terminal 105, the FET 111 is turned on and the FET 112 is turned off. Therefore, the RF signal transmits between the RF terminals 101 and 102. The RF signal is prohibited from transmitting between the RF terminals 101 and 103. When the control signal Vcon=0V is input to the control terminal 105, in contrast, the FET 112 is turned on and the FET 111 is turned off. Therefore, the RF signal transmits between the RF terminals 101 and 103, while it is prevented from transmitting between the RF terminals 101 and 102. Thus, the SPDT switch can switch the two transmission routes: the route between the RF terminals 101 and 102 and the route between the RF terminals 101 and 103.

The SPDT switch is used as a selector switch in, for example, a PHS and a cellular phone. In this case, the RF terminal 101 is connected to an antenna, the RF terminal 102 is connected to a receiving section and the RF terminal 103 is connected to a transmitting section. When the antenna receives a radio carrier signal from a base station, the FET 111 is turned on, so that the receiving section receives the radio carrier signal. The radio carrier signal is down-converted to an intermediate frequency signal in the receiving section, and demodulated in a demodulating section. On the other hand, a voice signal of the user input through a talk unit of the PHS or cellular phone is compressed and encoded, and thereafter digital-modulated to an intermediate frequency signal by a modulating section. The intermediate frequency signal is up-converted to a radio carrier signal in the transmitting section. Then, when the FET 112 is turned on, the radio carrier signal is supplied from the transmitting section to the antenna, and transmitted from the antenna to the base station.

In the above SPDT switch, the resistor elements 161 to 163 and the capacitor element 153 are provided at the nodes (133, 131, 134, 132) respectively connected to the power source terminal 104, the control terminal 105, the GND terminal 106 and the output terminal 132. Since static electricity is discharged through these semiconductor elements, the resistance of the SPDT switch to ESD (Electrostatic Discharge) breakdown is improved.

In addition, the resistor element 164 is provided between the output node of the source follower circuit 140 and the output node of the inverter circuit 150. A relatively high voltage is applied to the input node of the inverter circuit 150, i.e., to the gate of the E-FET 152, even if the FET is off. Therefore, electrostatic breakdown easily occurs in the E-FET 152 in particular. However, since the resistor element 164 is connected to the gate of the E-FET 152, electrostatic breakdown of the E-FET 152 is prevented and the resistance of the SPDT switch to the EST breakdown is improved.

It is preferable that the resistor element 162 has a resistance value of several tens of kΩ. The provision of the resistor element 162 having such a high resistance value to an input node of the inverter section 130 produces effects of reducing the Schottky current as well as improving the resistance to the ESD. Consequently, the power consumption by the inverter section 130 can be reduced.

The provision of the capacitor element 153 produces effects of not only improving the resistance to the ESD, as described above, but also suppressing fluctuations of the voltage at the output terminal 132 by an influence of the RF signal leaked from the switch section 110 when a large current is input. As a result, the distortion, which may occur in the RF signal transmitting through the FETs 111 and 112, is suppressed.

Moreover, the circuit configuration according to the first embodiment includes the protecting diodes 165 to 167. The protecting diodes perform a function of dissipating a large current generated by ESD. In other words, when ESD occurs, even if static electricity is not sufficiently discharged through the resistor elements and the capacitor elements, the large current owing to ESD can be allowed to flow through the protecting diodes 165 to 167. Therefore, the switch section 110 and the inverter section 130 can be protected. The inverter section 130 is protected by the protecting diodes 166 and 167 from ESD breakdown. Since the switch section 110 is connected to the inverter section 130, it must also be protected from ESD breakdown. Protection of the switch section 110 is achieved by inserting the protecting diode 165 between the control terminal 105 and the RF terminal 101.

More specifically, the withstand voltage with respect to the ESD breakdown is 50V in the conventional structure including no protecting diode. The withstand voltage is 110V in the structure according to the first embodiment in which the protecting diodes 165 to 167 are inserted.

In the first embodiment, the protecting diode 165 is inserted between the control terminal 105 and the RF terminal 101. However, the same effect can be obtained, even if it is inserted between another RF terminal and the DC terminal.

Further, since the protecting diodes 165 to 167 are connected to the RF terminals, they are require to withstand a voltage higher than the power source voltage. Thus, ESD breakdown can be prevented without deteriorating the RF characteristics.

As described above, the switching device according to the first embodiment comprises the resistor elements, the capacitor elements and the protecting diodes for the purposes of preventing ESD breakdown, reducing power consumption and suppressing distortion. As a result, there is provided a high-frequency SPDT switch MMIC incorporating a control section, in which surge resistance can be improved without deteriorating the characteristics of low loss, high isolation and low distortion.

Figure 3A:
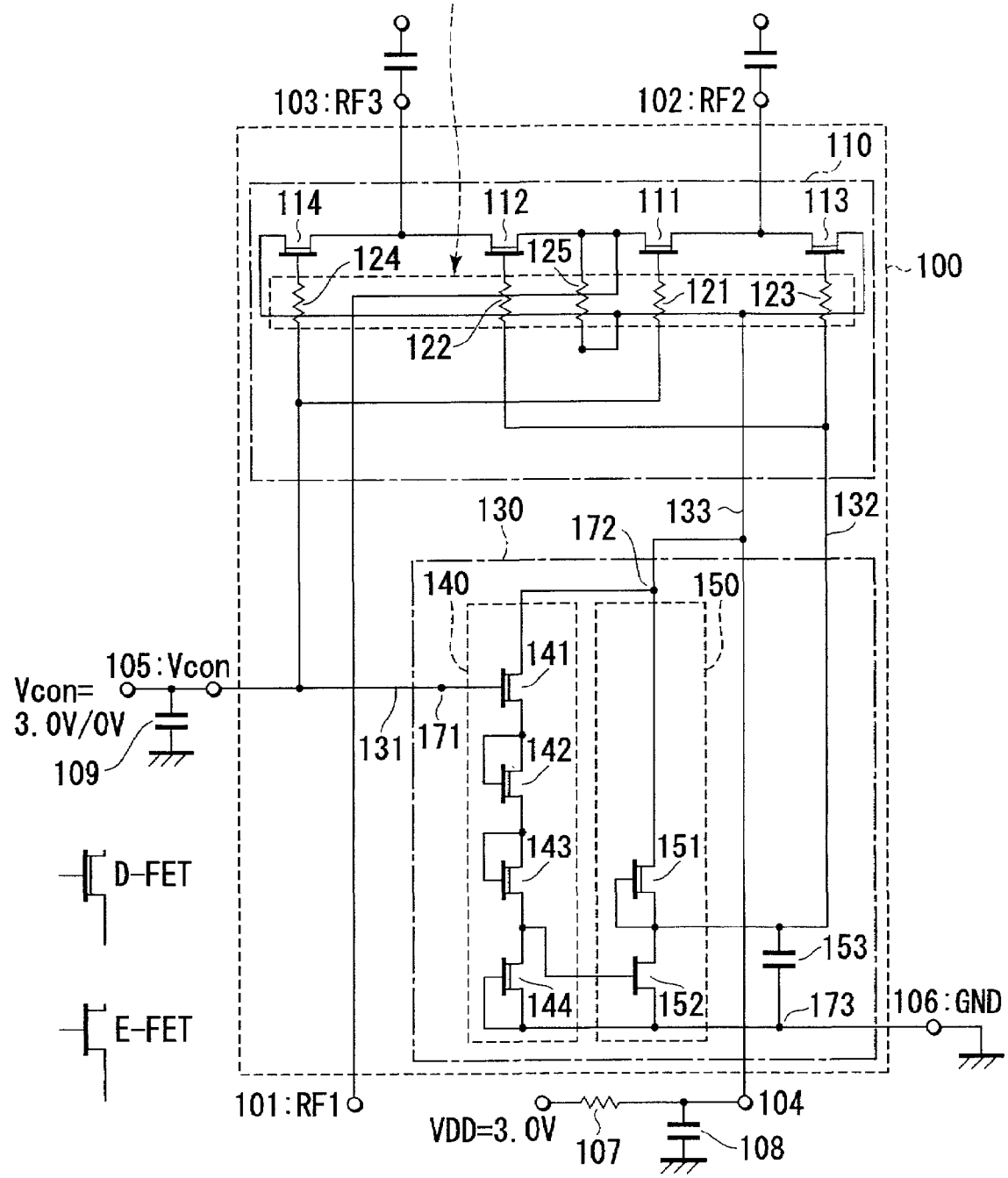
FIG. 3A is a circuit diagram of an SPDT switch according to a second embodiment of the present invention.

A switch incorporating a control circuit will be described with reference to FIG. 3A as an example of a high-frequency switching device according to a second embodiment of the present invention. FIG. 3A is a circuit diagram of a high frequency SPDT switch formed as an MMIC, which is mounted in a six-pin package in particular.

As shown in FIG. 3A, an MMIC 100 according to this embodiment is different from the MMIC 100 of the first embodiment in that it does not include the resistor elements 161 to 164 and the protecting diodes 165 to 167. Further, in the switch section 110, the resistor elements 121 to 124 connected to the gates of the FETs 111 to 114 and the bias resistor element 125 are arranged parallel to each other in a row (see a region AA1 in FIG. 3A). Furthermore, a metal wire for transmitting an RF signal is laid above the region AA1 in which the resistor elements 121 to 125 are arranged.

Each of the resistor elements 121 to 125 is made of, for example, an impurity diffusion layer formed in a GaAs substrate. It has a resistance value of several kΩ. FIG. 3B shows a cross section of any one of the resistor elements 122, 124 and 125. As shown in the figure, an impurity diffusion layer 11 serving as one of the resistor elements 122, 124 and 125 is formed in a GaAs substrate 10. An interlayer insulating film 12 is provided on the GaAs substrate 10, and a metal wiring layer 13 is provided on the interlayer insulating film 12. The metal wiring layer 13 is connected to the impurity diffusion layer 11 by plugs 14. Further, an interlayer insulating film 15 is provided on the interlayer insulating film 12. Two metal wiring layers 16 are provided on the interlayer insulating film 15. One of the metal wiring layers 16 is an RF signal wire connected to the RF terminal 101 and the other is a power source wire connected to the power source terminal 104. The metal wiring layers 16 overlap the impurity diffusion layer 11 in a direction perpendicular to the GaAs substrate 10 and do not overlap the metal wiring layer 13.

FIG. 3C is a plan pattern diagram of a semiconductor chip on which the SPDT switch shown in FIG. 3A is formed. It shows pad arrangement in particular. As shown in the figure, a switch circuit 21 is formed in a semiconductor chip 20. The switch circuit 21 is an SPDT switch as shown in FIG. 3A. Six bonding pads 22-1 to 22-6 are provided in the chip 20, and connected to the switch circuit 21 by wires 23 in the chip. The bonding pads 22-1 to 22-6 are respectively connected to the RF terminal 102, the GND terminal 106, the RF terminal 103, the control terminal 105, the RF terminal 101 and the power source terminal 104 in the switch circuit 21. It should be noted that the bonding pad 22-5 connected to the RF terminal 101 is arranged to be opposed to the bonding pads 22-1 and 22-3 connected to the RF terminals 102 and 103. Further, the bonding pads 22-1 to 22-6 are arranged such that the length of the wire between the bonding pads 22-5 and 22-1 and the positional relationship therebetween are substantially the same as those between the bonding pads 22-5 and 22-3.

FIG. 3D shows a state of mounting of the semiconductor chip shown in FIG. 3C. As shown in the figure, the semiconductor chip 20 is mounted on a die pad 30 of a lead frame. The bonding pads 22-1 to 22-6 are respectively connected to inner leads 31-1 to 31-6 via bonding wires 32. The inner lead 31-5 wire-bonded to the bonding pad 22-5 is arranged to be opposite to the inner leads 31-1 and 31-3 wire-bonded to the bonding pads 22-1 and 22-3. Further, the inner leads 31-1 to 31-6 are electrically connected to outer leads (not shown).

FIG. 3E shows an exterior of a device in which the semiconductor chip 20 is packaged. As shown in the figure, the semiconductor chip 20 and the lead frame shown in FIG. 3D are sealed in resin 40, thus completing a semiconductor device. Six outer leads are exposed out of the sealing resin 40. Pins 1 to 6 are respectively connected to the RF terminal 102, the GND terminal 106, the RF terminal 103, the control terminal 105, the RF terminal 101 and the power source terminal 104.

The operation of the SPDT switch of the second embodiment is the same as that of the first embodiment, and a description thereof is omitted.

As described above, in the SPDT switch according to the second embodiment, the resistor elements 121 to 124 of high resistance are connected to the gates of the FETs 111 to 114. These resistor elements 121 to 124 function to prevent the transmitting RF signal from leaking to the gates of the FETs 111 to 114 and further flowing into the control terminal 105, the output terminal 132 of the inverter section 130 and the power source terminal 104. Therefore, the RF signal can efficiently transmit between the RF terminal 101 and the RF terminal 102 or 103, thereby reducing loss generated in the FETs 111 to 114.

The resistor elements 121 to 125 are arranged in a row, and the metal wire for transmitting the RF signal is laid above the region in which the resistor elements 121 to 125 are arranged. Since the wire thus overlaps the semiconductor elements, the space area can be used effectively, resulting in downsizing of the chip. As described above, the resistor elements 121 to 125 have high resistance, since they are provided to prevent the RF signal from leaking. Therefore, in the case where the resistor elements 121 to 126 of high resistance are formed of impurity diffusion layers, the impurity diffusion layers are inevitably wide. Therefore, a plurality of metal wires can be provided above the impurity diffusion layer. In this embodiment, the RF wire connected to the RF terminal 101 and the power source wire connected to the power source terminal 104 are provided. However, it is possible to provide more wires in addition to these two wires. Further, as shown in FIG. 3B, the interlayer insulating films 12 and 15 existing above the impurity diffusion layer 11 are sufficiently thick. Therefore, a parasitic capacitance generated by the impurity diffusion layer 11, the metal wires 16 and the interlayer insulting films 12 and 15 is sufficiently small, i.e., smaller than the parasitic capacitance generated between the other crossing wires, and does not present a problem. The resistor elements 121 to 125 are not necessarily formed of an impurity diffusion layer, but may be formed of, for example, a silicon layer or a GaAs layer formed on the GaAs substrate 10.

Further, as shown in FIGS. 3C and 3D, the semiconductor chip 20 is packaged as an MMIC having six pins. The pad connected to the RF terminal 101 is arranged to be opposed to the pads connected to the RF terminals 102 and 103. As a result, the characteristics of the signal transmitting from the RF terminal 101 to 102 are substantially equal to those from the RF terminal 101 to 103, so that the symmetry of the RF signal transmission characteristics can be achieved.

According to the conventional circuit configuration, to arrange the pads symmetrically, it is unavoidable that the wires cross. The crossover of wires results in generation of a parasitic capacitance. In addition, the wire that crosses the RF wire is adversely influenced by a leaked RF signal. Therefore, it is desirable to avoid a crossover of wires. For this purpose, the wires must be detoured, so that the pads can be arranged symmetrically, while a crossover of the wires can be prevented. In this case, since a wiring region for a detour is additionally required, the chip size may be increased to arrange the pads symmetrically. Therefore, for symmetrical arrangement of pads, if avoidance of a crossover of the wires is given a higher priority, the wires must be detoured, resulting in an increase in chip size. To the contrary, if reduction in chip size is given a higher priority, the wires must cross. In this case, the reliability of the switching operation is lowered owing to generation of a parasitic capacitance and leakage of an RF signal.

However, according to the circuit configuration of this embodiment, the resistor elements 121 to 125 are aligned and the RF wire are arranged above the resistor element region. In fact, the RF wires cross over the resistor elements 121 to 125 in this region; however, since the parasitic capacitance is very small, the crossing of the wires and the resistor elements have substantially no adverse influence on the operation of the SPDT switch. Thus, with the cross arrangement of the RF wires and the resistor elements 121 and 125, it is unnecessary to detour the RF wires. Consequently, the pads can be arranged symmetrically without increasing the chip size. Moreover, the RF wires cross only the resistor elements, but does not cross the other wires. Although the RF signal leaked from the RF wire considerably influences a wiring region, it has substantially no influence on the resistor elements. Therefore, although the resistor elements 122, 124 and 125 cross the RF wired, the gate potentials of the FETs 112 and 114 and the bias potential of the FETs 111 and 112 receive substantially no influence of the RF signal leaked from the RF wires. As a result, the RF signal transmitting between the RF terminals can be prevented from distortion. In addition, the loss incurred in the FETs 111 and 112 can be reduced. Thus, the second embodiment of the present invention can achieve both the reduction in chip size and the high reliability of the switching operation, which cannot be easily achieved simultaneously by the conventional art.

Figure 1A:
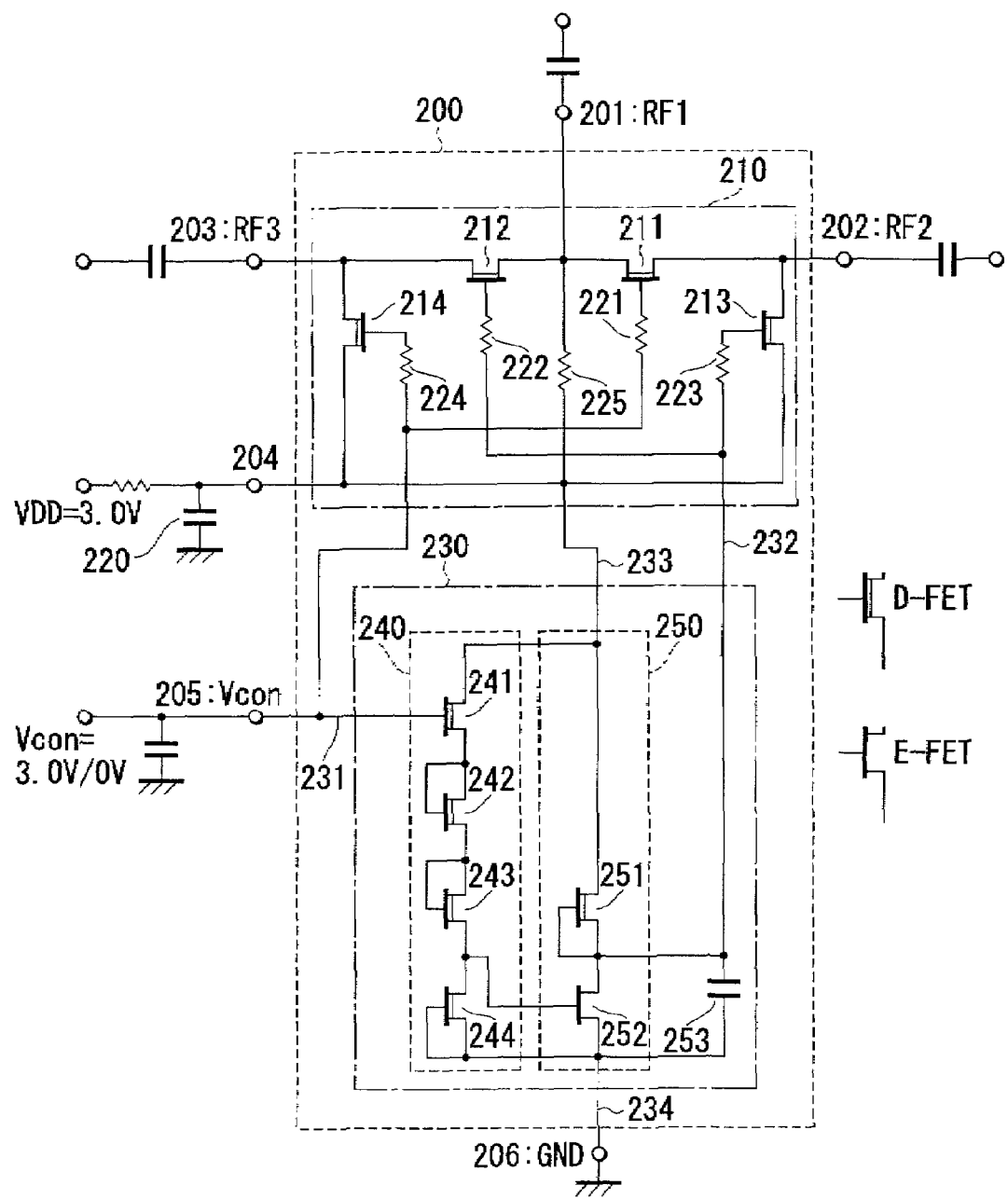
FIG. 1A is a circuit diagram showing a conventional SPDT switch.
Figure 1B:
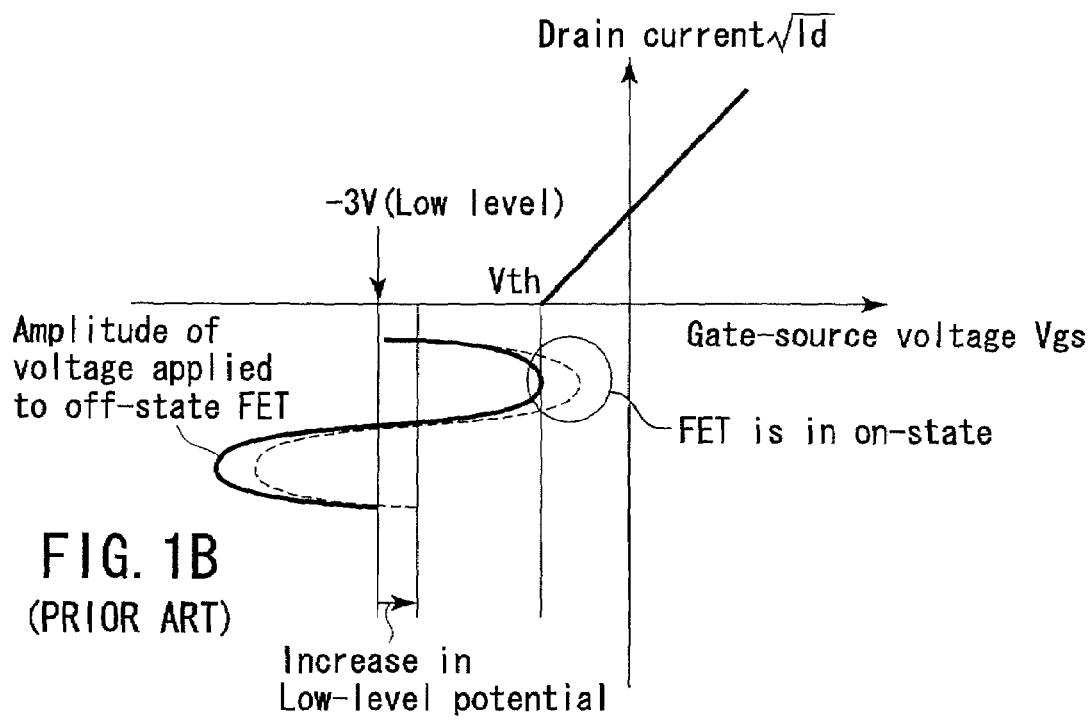
FIG. 1B is a diagram showing the relationship between a gate-source voltage and a current in an off-state FET.
Figure 1C:
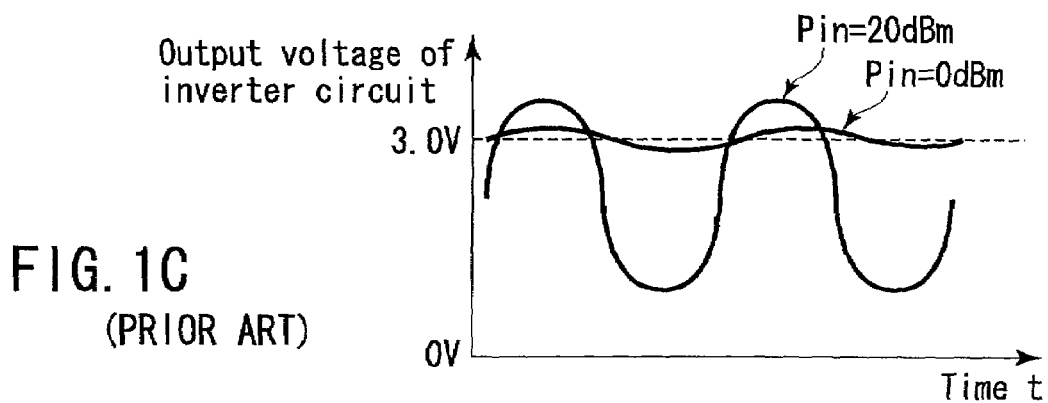
FIG. 1C is a characteristic diagram showing a change in output voltage of the inverter circuit.
Figure 1D:
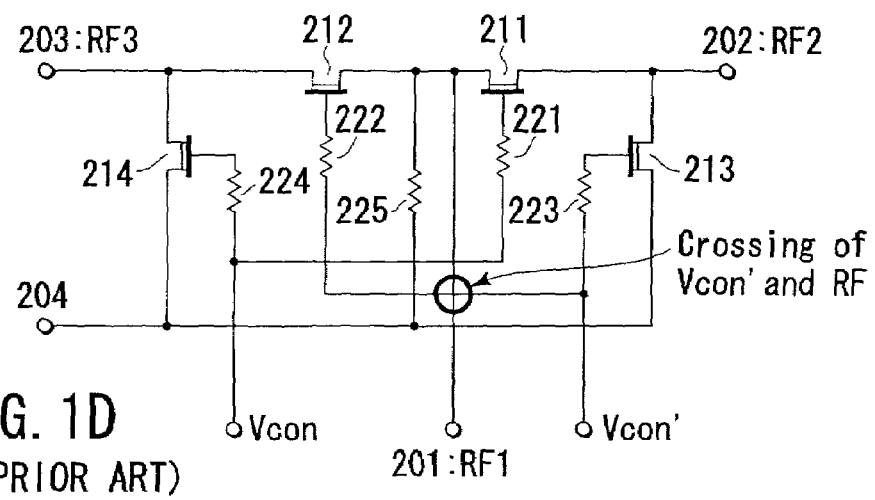
FIG. 1D is a circuit diagram showing a conventional switch section.
Figure 3F:
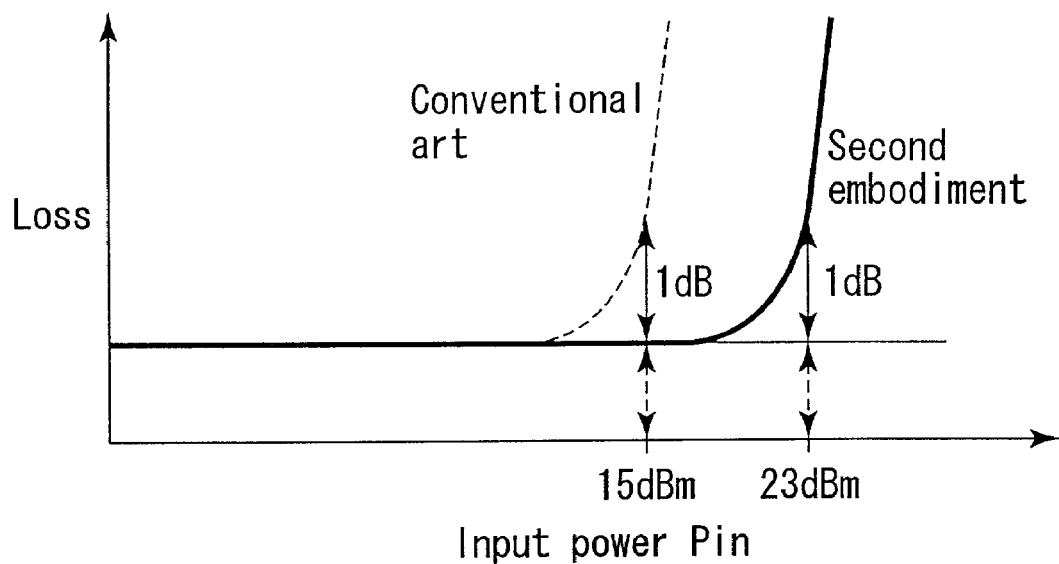
FIG. 3F is a characteristic diagram showing input voltage-loss characteristics of the conventional SPDT switch and the SPDT switch according to the second embodiment.

FIG. 3F shows input voltage-loss characteristics of the conventional SPDT switch and the SPDT switch according to the second embodiment. It is assumed that, in the conventional high frequency SPDT switch, the wire connected to the output terminal 232 (Vcon') of the inverter section 230 crosses an RF wire, as shown in FIG. 1D.

As shown in FIG. 3F, with the conventional SPDT, a loss of 1 dB is incurred when the input power Pin is increased to 15 dBm. With the SPDT switch according to the second embodiment, a loss of 1 dB is incurred when the input power Pin is increased to 23 dBm. Thus, according to the second embodiment, the characteristic is improved by about 8 dB.

In this embodiment, the capacitor element 153 is also provided between the output terminal 132 of the inverter section 130 and the GND terminal 106. Therefore, it produces the same effect as that obtained by providing a decoupling capacitor outside the package. Consequently, the switching operation can stable even when a large signal is input.

Figure 3G:
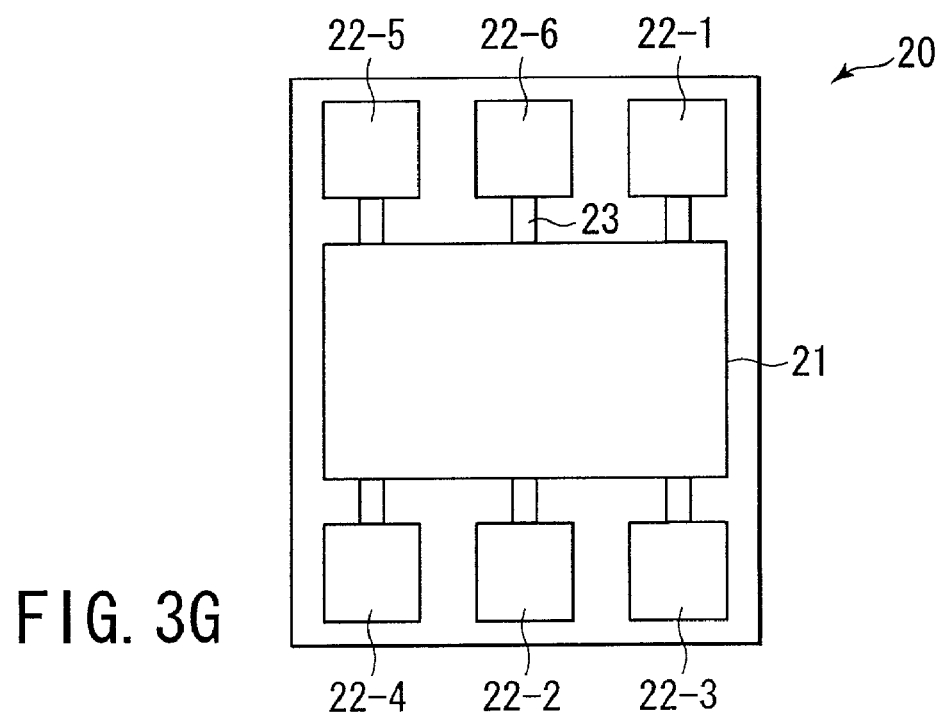
FIG. 3G is a plan pattern diagram of an SPDT switch according to a modification of the second embodiment.

With the SPDT switch according to the second embodiment, the distortion can be prevented and the control section can operate stably in a high power input time, while an increase in chip size can be suppressed. The arrangement of the pads 22-1 to 22-6 is not limited to that as shown in FIG. 3C. Of course, the arrangement shown in FIG. 3C is ideal, in which the pads 22-1 and 22-3 are symmetrical with respect to the pad 22-5. However, the arrangement shown in, for example, FIG. 3G, is satisfactory. In other words, even if the pads 22-1 and 22-3 are not perfectly symmetrical with respect to the pad 22-5, the arrangement will be acceptable, so far as the change in characteristic does not practically raise a problem. Particularly, with the arrangement shown in FIG. 3G, the chip area can be smaller than that of the arrangement shown in FIG. 3C.

As described above, according to the first and second embodiments, there is provided a high-frequency switching device incorporating a control section, in which surge resistance can be improved without deteriorating the characteristics of low loss, high isolation and low distortion. There is also provided a high-frequency switching device incorporating a control section, in which the distortion can be prevented and the control section can operate stably in a high power input time, while an increase in chip size is suppressed.

Figure 4:
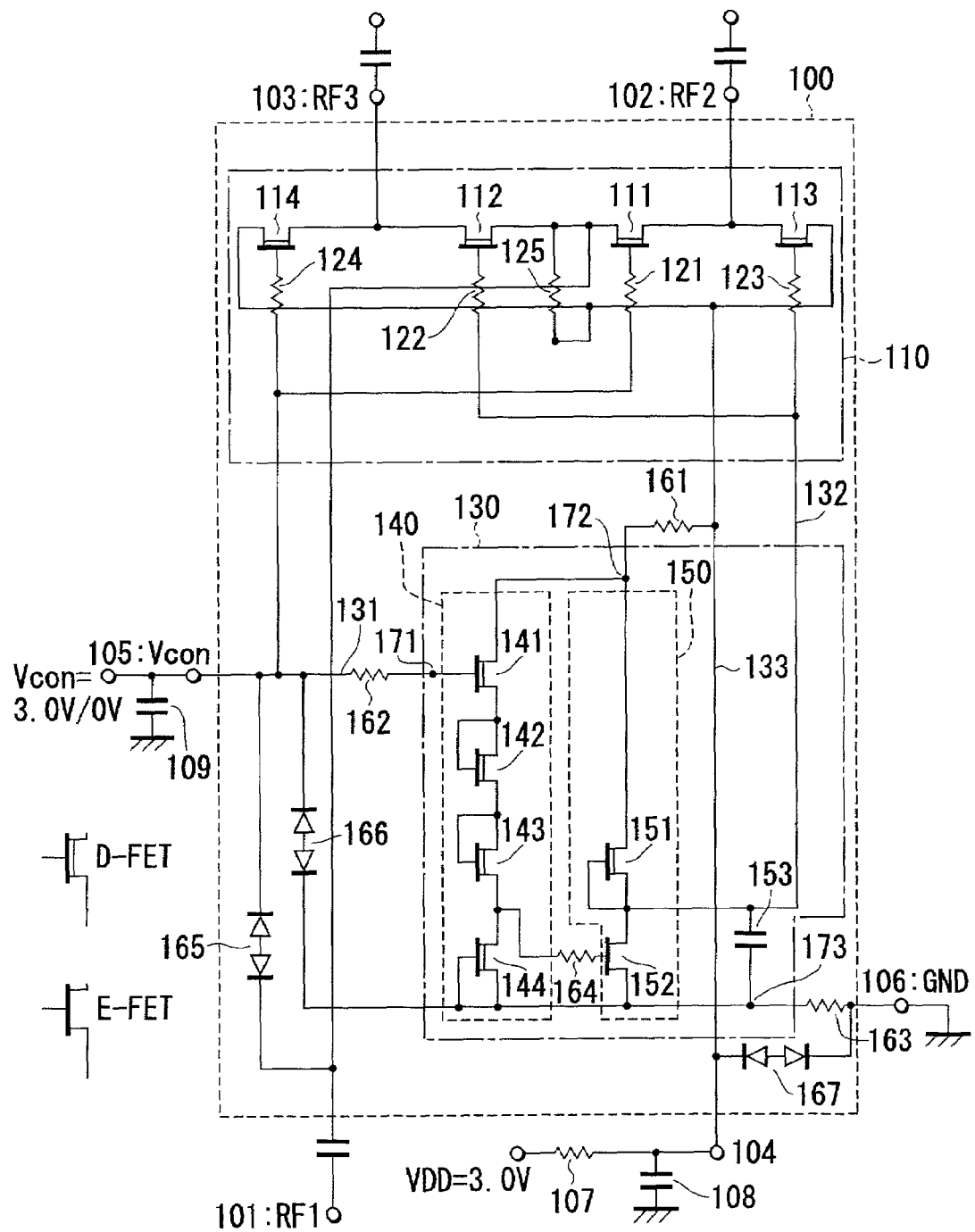
FIG. 4 is a circuit diagram of a SPDT switch according to a modification of the first and second embodiments.

The first and second embodiments can be worked separately or combined as needed. FIG. 4 is a circuit diagram of a SPDT switch according to a modification of the first and second embodiments. As shown in the figure, the SPDT switch of this modification has a circuit configuration according to the second embodiment, which further includes the resistor elements 161 to 164 and the protecting diodes 165 to 167 of the first embodiment. With this structure, all the advantages of the first and second embodiments can be obtained. Further, although the circuit configurations using MESFETs have been described in connection with the above embodiments, MOSFETs can be used instead. Furthermore, the circuit configurations of the switching circuit are not limited to those shown in FIG. 2, 3A or 4. Further, the switching device according to the embodiment of this invention is not limited to the-SPDT switch.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high frequency switching device comprising:
a control terminal;
a power source terminal;
a GND terminal;
an RF terminal;
a switch section which switches input/output routes of an RF signal input from the RF terminal;
a control section which controls the switching section, the control section connected to the control terminal and the power source terminal; and
protecting diodes provided between the control terminal and the RF terminal, between the control terminal and the GND terminal, and between the power source terminal and the GND terminal.

2. The high frequency switching device according to claim 1, further comprising:
a first terminal of the control section, the first terminal connected to the control terminal;
a second terminal of the control section, the second terminal connected to the power source terminal;
a third terminal of the control section, the third terminal connected to the GND terminal,
resistor elements provided between the first terminal of the control section and the control terminal, between the second terminal of the control section and the power source terminal and between the third terminal of the control section and the GND terminal.

3. The high frequency switching device according to claim 1, further comprising:
a capacitor element provided between an output terminal of the control section for controlling the switch section and the GND terminal.

4. The high frequency switching device according to claim 1, wherein the protecting diodes comprise diodes connected in the opposite directions.

5. The high-frequency switching device according to claim 1, wherein the control section comprises:
an inverter circuit including FETs;
a source follower circuit including the FETs, which shifts a level of a gate voltage applied to a gate of the FET included in the inverter circuit so as not to exceed a Schottky voltage; and
a resistor element provided between an output terminal of the source follower circuit and the gate of the FET included in the inverter circuit.

6. The high-frequency switching device according to claim 1, wherein the protecting diodes protect the switch section and the control section from ESD breakdown.

7. A high-frequency switching device comprising:
a control terminal;
a power source terminal;
an RF terminal;
a switch section which switches input/output routes of an RF signal input from the RF terminal and includes a plurality of FETs having gates connected to resistor elements aligned in a row, said switch section including an RF signal wire which is laid above a region where the resistor elements are aligned and through which the RF signal transmits; and
a control section which controls the switching section, the control section connected to the control terminal and the power source terminal.

8. The high-frequency switching device according to claim 7, wherein a wire connected to an output terminal of the control section for controlling the switch section crosses no RF signal wire.

9. The high-frequency switching device according to claim 7, further comprising a capacitor element provided between an output terminal of the control section for controlling the switch section and a GND terminal.

10. The high-frequency switching device according to claim 7, further comprising
a first terminal of the control section, the first terminal connected to the control terminal;

a second terminal of the control section, the second terminal connected to the power source terminal;

a third terminal of the control section, the third terminal connected to a GND terminal, resistor elements provided between the first terminal of the control section and the control terminal, between the second terminal of the control section and the power source terminal and between the third terminal of the control section and the GND terminal.

11. The high-frequency switching device according to claim 7, wherein the control section comprises:

an inverter circuit including FETs;

a source follower circuit including the FETs, which shifts a level of a gate voltage applied to a gate of the FET included in the inverter circuit so as not to exceed a Schottky voltage; and a resistor element provided between an output terminal of the source follower circuit and the gate of the FET included in the inverter circuit.

12. The high-frequency switching device according to claim 7, wherein the resistor elements are formed of an impurity diffusion layer provided in a semiconductor substrate.

13. The high-frequency switching device according to claim 12, wherein the resistor elements prevent the RF signal from leaking to the gates of the FETs.

14. The high-frequency switching device according to claim 7, further comprising protecting diodes provided between the control terminal and the RF terminal, between the control terminal and a GND terminal, and between the power source terminal and the GND terminal.

15. The high frequency switching device according to claim 14, wherein the protecting diodes comprise diodes connected in the opposite directions.

16. The high-frequency switching device according to claim 14, wherein the protecting diodes protect the switch section and the control section from ESD breakdown.

* * * * *